US009767908B2

(12) United States Patent
Bushnaq et al.

(10) Patent No.: US 9,767,908 B2
(45) Date of Patent: Sep. 19, 2017

(54) SEMICONDUCTOR MEMORY DEVICE THAT APPLIES AN INITIAL PASS VOLTAGE FOLLOWED BY A FINAL PASS VOLTAGE TO NON-SELECTED WORD LINES DURING A WRITE OPERATION

(71) Applicant: Toshiba Memory Corporation, Tokyo (JP)

(72) Inventors: Sanad Bushnaq, Kanagawa (JP); Masanobu Shirakawa, Kanagawa (JP); Hidehiro Shiga, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/055,262

(22) Filed: Feb. 26, 2016

(65) Prior Publication Data
US 2016/0267990 A1 Sep. 15, 2016

(30) Foreign Application Priority Data
Mar. 12, 2015 (JP) .................................. 2015-049693

(51) Int. Cl.
*G11C 16/32* (2006.01)
*G11C 16/16* (2006.01)
*G11C 16/26* (2006.01)
*G11C 16/10* (2006.01)

(52) U.S. Cl.
CPC .............. *G11C 16/10* (2013.01); *G11C 16/16* (2013.01); *G11C 16/26* (2013.01); *G11C 16/32* (2013.01)

(58) Field of Classification Search
CPC ......... G11C 16/10; G11C 16/16; G11C 16/26; G11C 16/32
See application file for complete search history.

(56) References Cited

U.S. PATENT DOCUMENTS

| 7,859,902 | B2 * | 12/2010 | Maejima | ................. G11C 5/02 365/185.05 |
| 8,406,063 | B2 * | 3/2013 | Mokhlesi | ............ G11C 11/5628 365/185.14 |
| 8,427,878 | B2 * | 4/2013 | Shim | ................. G11C 16/0483 365/185.17 |
| 9,208,886 | B2 * | 12/2015 | Nam | ..................... G11C 16/10 |

(Continued)

FOREIGN PATENT DOCUMENTS

JP 2009-266946 A 11/2009

*Primary Examiner* — Hoai V Ho
*Assistant Examiner* — Roberto Mancera, Jr.
(74) *Attorney, Agent, or Firm* — Patterson & Sheridan, LLP

(57) ABSTRACT

A non-volatile semiconductor memory device includes a first memory cell above a substrate and electrically connected to a first word line, a second memory cell above the first memory cell and electrically connected to a second word line, and a controller. The controller is configured to execute a write operation that includes a first step in which a first voltage is applied to a selected word line and to a non-selected word line, a second step after the first step in which a program voltage is applied to the selected word line, and a third step after the second step in which a second voltage higher than the first voltage is applied to the non-selected word line. A time period between a start of the second step and a start of the third step is different depending on whether the first or second memory cell is being written.

20 Claims, 9 Drawing Sheets

(56) References Cited

U.S. PATENT DOCUMENTS 9,406,383 B2 * 8/2016 Park .................. G11C 16/08
2016/0148691 A1 * 5/2016 Rabkin ............... G11C 16/10
                                                365/185.19

* cited by examiner

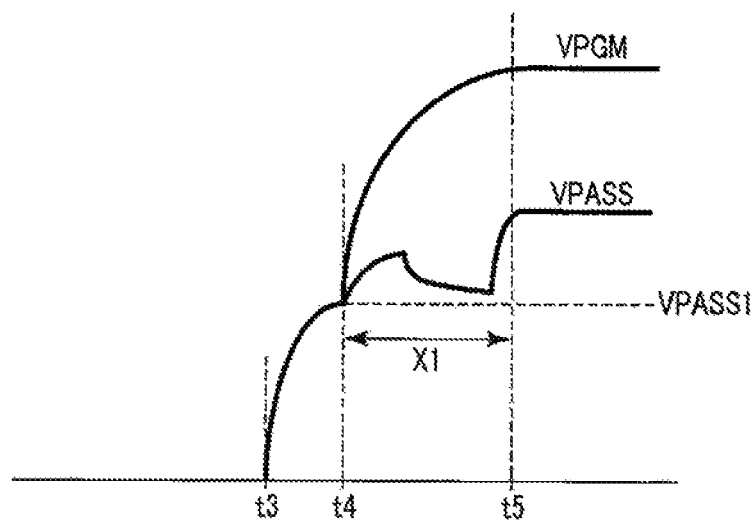
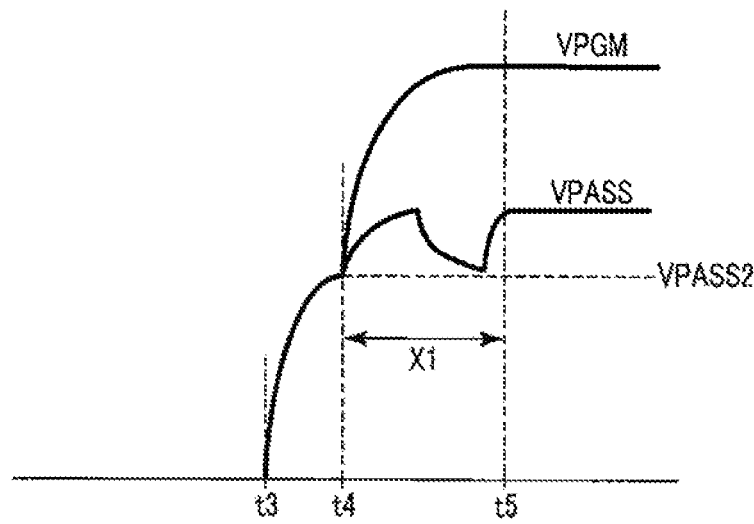

SEMICONDUCTOR MEMORY DEVICE THAT APPLIES AN INITIAL PASS VOLTAGE FOLLOWED BY A FINAL PASS VOLTAGE TO NON-SELECTED WORD LINES DURING A WRITE OPERATION

CROSS-REFERENCE TO RELATED APPLICATION

This application is based upon and claims the benefit of priority from Japanese Patent Application No. 2015-049693, filed Mar. 12, 2015, the entire contents of which are incorporated herein by reference.

FIELD

Embodiments described herein relate generally to a non-volatile semiconductor memory device.

BACKGROUND

A NAND type flash memory in which memory cells are arranged in three dimensions is known.

DESCRIPTION OF THE DRAWINGS

FIG. 6 is a timing diagram illustrating a voltage waveform of an upper layer word line of a first example in the write operation.

FIG. 7 is a timing diagram illustrating a voltage waveform of a lower layer word line of the first example in the write operation.

DETAILED DESCRIPTION

Figure 1:
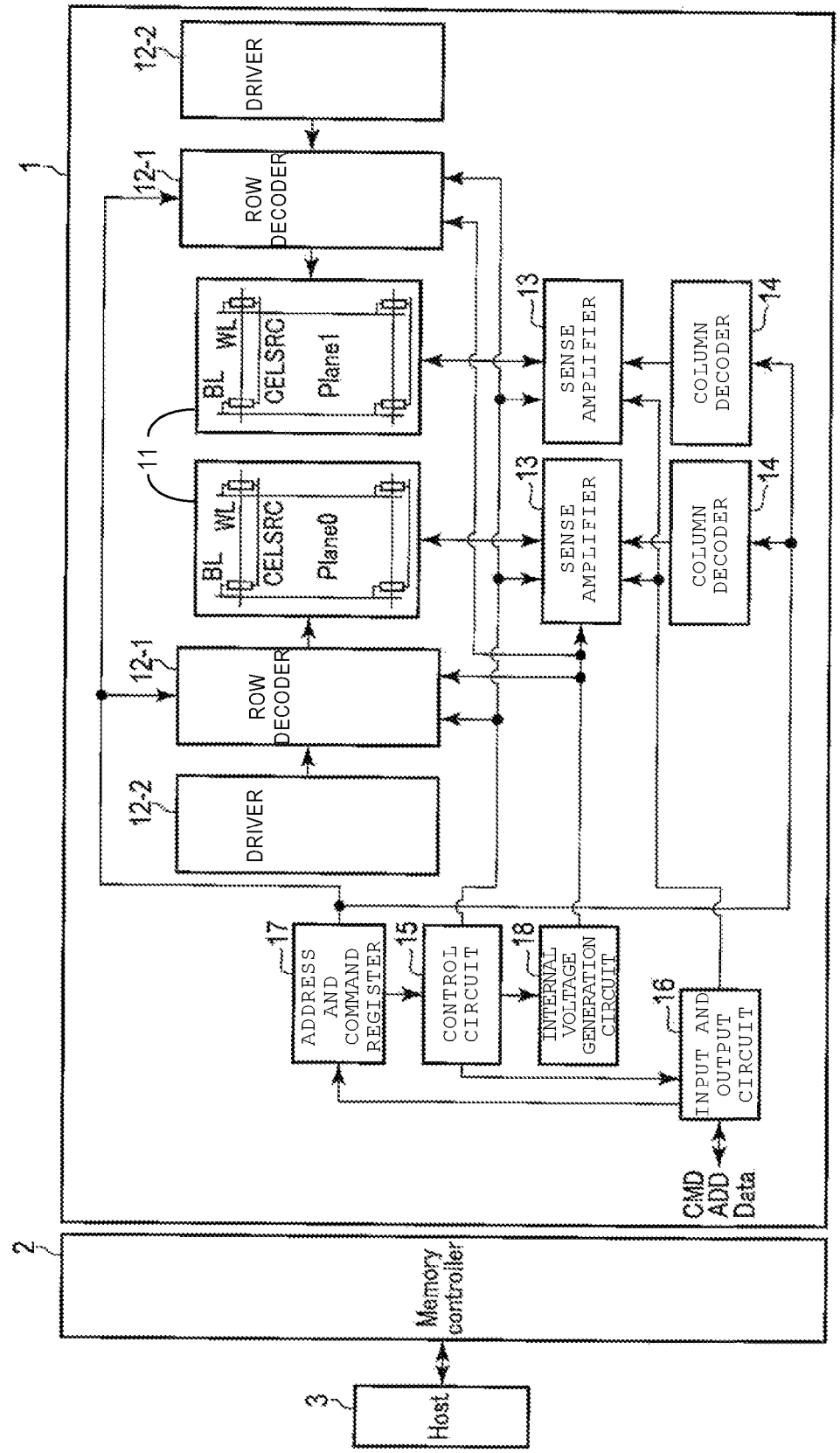
FIG. 1 is a diagram illustrating a configuration of a non-volatile semiconductor memory device according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A non-volatile semiconductor memory device which is capable of shortening write time and read time is provided.

In general, according to one embodiment, a non-volatile semiconductor memory device includes a first memory cell above a substrate and electrically connected to a first word line, a second memory cell above the first memory cell and electrically connected to a second word line, and a controller. The controller is configured to execute a write operation that includes a first step in which a first voltage is applied to a selected word line and to a non-selected word line, a second step after the first step in which a program voltage is applied to the selected word line, and a third step after the second step in which a second voltage higher than the first voltage is applied to the non-selected word line. A time period between a start of the second step and a start of the third step is different depending on whether the first memory cell is being written or the second memory cell is being written.

Hereinafter, the non-volatile semiconductor memory device of the embodiments will be described with reference to the drawings. Here, an example of the non-volatile semiconductor memory device is a NAND flash memory. In the description below, common reference symbols are applied to components having the same functions and configurations.

First Embodiment

1. Entire Configuration

With reference to FIG. 1, a configuration of the non-volatile semiconductor memory device according to the first embodiment will be described. A memory system includes a non-volatile semiconductor memory device 1, a memory controller 2 which controls the non-volatile semiconductor memory device 1, and a host 3.

As illustrated in FIG. 1, the non-volatile semiconductor memory device 1 according to the first embodiment includes a memory cell array 11, a row decoder 12-1, a driver 12-2, a sense amplifier 13, a column decoder 14, a control circuit 15, an input and output circuit 16, an address and command register 17, and an internal voltage generation circuit 18.

1.1 Memory Cell Array 11

The memory cell array 11 includes, for example, a plane P0 and a plane P1 (illustrated as Plane0 and Plane1 in FIG. 1). The plane P0 and the plane P1 include a plurality of memory strings MS. In the memory string MS, a bit line BL, a word line WL, and a source line CELSRC are electrically connected to each other. As will be described later, the memory string MS includes a plurality of memory cells MC which are connected in series, and the word line WL described above is connected to a control gate CG of the memory cell MC.

Here, an example in which the plane P0 and the plane P1 are included is provided; however, the number of planes P which are included in the memory cell array 11 is not limited. In addition, if the plane P0 and the plane P1 are not distinguished from each other, these are simply referred to as a plane P.

1.2 Row Decoder 12-1 and Driver 12-2

First, the row decoder 12-1 (hereinafter, the row decoder 12-1 may be also referred to as a block decoder 12-1) will be described.

The row decoder 12-1 decodes a plane address, a block address, or the like received from the address and command register 17, and selects the plane P and a block BLK in the plane P in response to the decoded result. That is, the row decoder 12-1 activates the block BLK designated by the plane address and the block address. Next, the row decoder 12-1 supplies voltage generated by the driver 12-2 to the word line WL in the selected block BLK.

Next, the driver 12-2 will be described with reference to FIG. 2.

Figure 2:
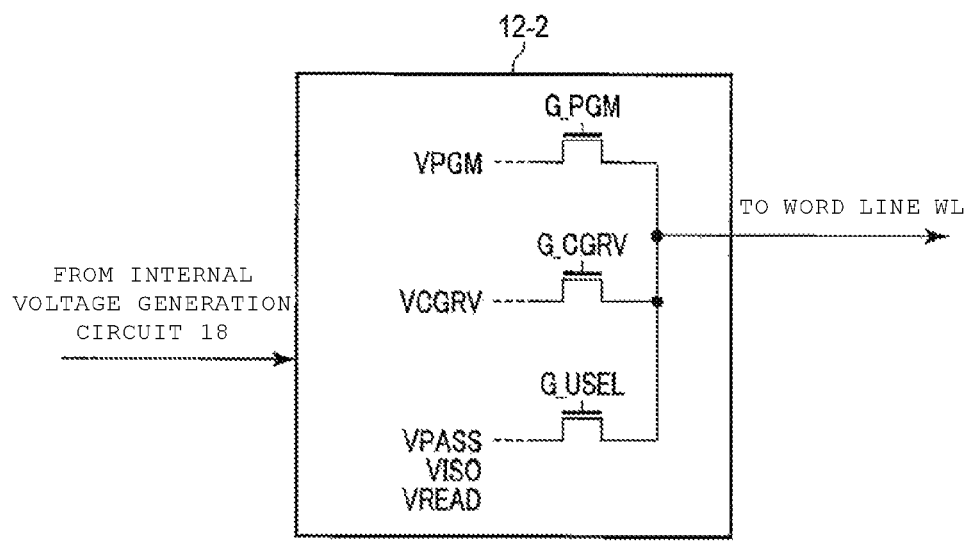
FIG. 2 is a circuit diagram of a driver in the non-volatile semiconductor memory device.

As illustrated in FIG. 2, the driver 12-2 includes a MOS transistor which transmits a voltage VPGM, a voltage VCGRV, a voltage VPASS, a voltage VISO, and a voltage VREAD to the predetermined word line WL. When the control circuit 15 sets a voltage level of a signal G_PGM to high ("H"), the driver 12-2 supplies the voltage VPGM to the selected word line WL through the row decoder 12-1. In the same manner, when the control circuit 15 sets a voltage level of a signal G_CGRV and a signal G_USEL to "H", the driver 12-2 respectively supplies the voltage VCGRV, the voltage VPASS, the voltage VISO, and the voltage VREAD to the word line WL through the row decoder 12-1.

1.3 Control Circuit 15

The control circuit 15 controls all operations of the non-volatile semiconductor memory device 1. That is, the control circuit 15 executes the operation sequence in the read operation and the write operation of the data based on a control signal, a command CMD, and an address ADD received from the address and command register 17.

The control circuit 15 controls each circuit block included in the non-volatile semiconductor memory device 1 to execute the operation sequence. For example, the control circuit 15 controls the internal voltage generation circuit 18 to generate the predetermined voltage, and controls a timing for outputting the predetermined voltage to the word line WL or the bit line BL through the row decoder 12-1 and the sense amplifier 13.

1.4 Sense Amplifier 13

The sense amplifier 13 has functions of reading the data from the memory cell MC and writing the data to the memory cell MC. For example, the non-volatile semiconductor memory device 1 receives the command CMD and the address ADD which instruct regarding the write operation or the read operation from the memory controller 2, the sense amplifier 13 reads the data from or writes the data to the memory cell MC of a selected page at a timing in response to an instruction from the control circuit 15.

1.5 Column Decoder 14

Returning to FIG. 1, peripheral circuits will be described. The column decoder 14 decodes a column address signal output from the address and command register 17, and selects a column direction of the memory cell array 11.

1.6 Input and Output Circuit 16

The input and output circuit 16 receives the command CMD, the address ADD, and the data from the memory controller 2, and supplies the command and the address to the address and command register 17. In addition, the input and output circuit 16 receives the data from the sense amplifier 13, and outputs the data to the memory controller 2. Further, the input and output circuit 16 receives the data from the memory controller 2 and sets the data in the sense amplifier 13.

1.7 Address and Command Register 17

The address and command register 17 temporarily holds the command CMD and the address ADD received from the input and output circuit 16, and then, supplies the command CMD to the control circuit 15 and supplies the address ADD to the row decoder 12-1 and the column decoder 14.

1.8 Internal Voltage Generation Circuit 18

The internal voltage generation circuit 18 generates the predetermined voltage in the read operation and the write operation based on a control of the control circuit 15.

In the write operation, the internal voltage generation circuit 18 generates the voltage VPGM, the voltage VPASS, and the voltage VISO. The driver 12-2 supplies the voltage VPGM to the selected word line WL, and supplies either the voltage VPASS or the voltage VISO to a non-selected word line WL.

The voltage VPGM causes charge to be injected to a charge storage layer which is included in the memory cell MC, which is described later, and is a voltage high enough to cause a threshold voltage of the memory cell MC to transition to a different level. In addition, the voltage VPASS is applied to the non-selected word line WL in the selected memory string MS and the voltage VPASS is a voltage that does not cause writing of data. Further, the voltage VISO is a voltage that electrically divides successive channels in the memory string MS for boosting a voltage of a channel in the memory string MS.

In the read operation, the internal voltage generation circuit 18 generates the voltage VCGRV and the voltage VREAD. The driver 12-2, supplies the voltage VCGRV to the selected word line WL, and supplies the voltage VRAED to the non-selected word line WL. Moreover, the voltage VREAD turns on the memory cell MC regardless of the data the memory cell is holding.

2. Sectional Structure of Plane P

Figure 3:
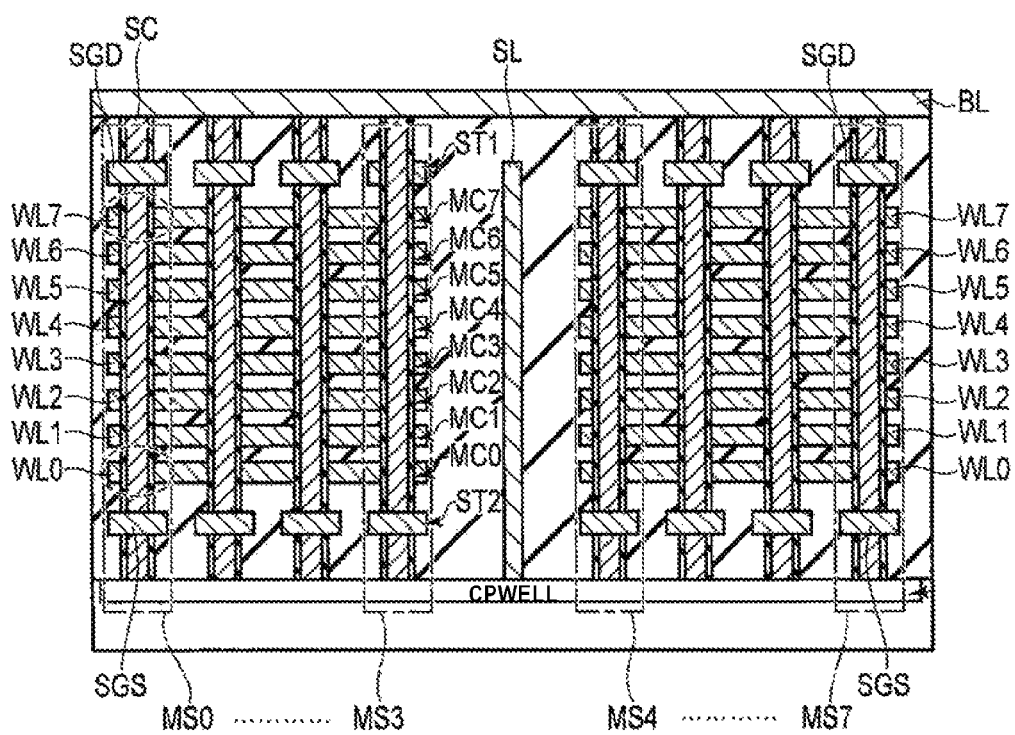
FIG. 3 is a sectional view of a memory cell array in the non-volatile semiconductor memory device.

FIG. 3 is a sectional view of a part of a region of the memory cell array 11 according to the embodiment. As illustrated in FIG. 3, each of the memory strings MS0 to MS7 (hereinafter, referred to as memory string MS) includes a select transistor ST2, dummy memory cells MCDS0 and MCDS1 (not illustrated), the memory cells MC0 to MC7, the dummy memory cells MCDD0 and MCDD1 (not illustrated), and the select transistor ST1 which are formed sequentially on the CPWELL from the bottom, and the semiconductor layer SC and the source line SL are formed in a normal direction of the CPWELL.

In the non-volatile semiconductor memory device according to the embodiment, signal lines SGD are adjacent to each other and signal lines SGS are adjacent to each other between the memory strings MS adjacent to each other. Further, the source line SL is formed between a memory string MS3 and a memory string MS4 in the normal direction. The source line SL is formed in a direction to the rear of the paper, and for example, may be formed in a wall shape, or may be formed in a pillar shape in the same manner as the semiconductor layer SC.

Such a three dimensional memory cell MC has smaller diameter in a lower layer portion of the semiconductor layer SC than that in an upper layer portion. It is because the semiconductor layer SC has a taper shape.

Figure 4:
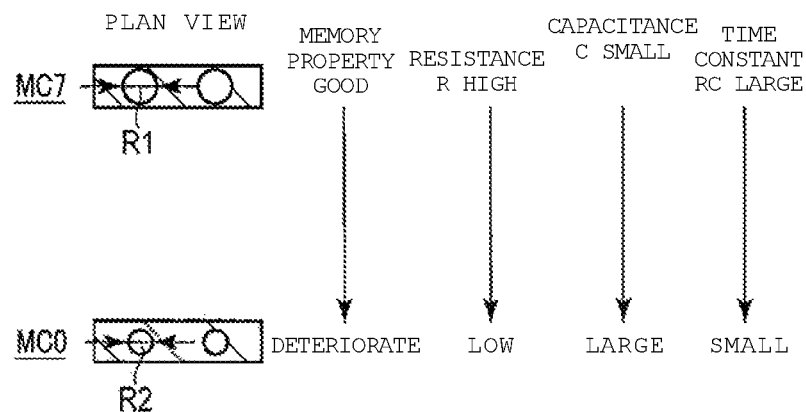
FIG. 4 is a conceptual diagram illustrating characteristics of memory cells in the non-volatile semiconductor memory device.

For example, as illustrated FIG. 4, when a diameter of the semiconductor layer SC of the upper layer (for example, memory cell MC7) is R1 and a diameter of the semiconductor layer SC of the lower layer (for example, memory cell MC0) is R2, the diameter R2 is smaller than the diameter R1 (R2<R1).

For this reason, a resistance value R of the word line WL ranges from "high" to "low" from the upper layer to the lower layer. Meanwhile, a capacitance C of the word line WL ranges from "small" to "large" from the upper layer toward the lower layer. Here, when the time constant RC of the word line WL is calculated, there is a tendency that the time constant RC ranges from "large" to "small" from the upper layer to the lower layer. Subsequently, the time constant of the word line of the upper layer is RCt, and the time constant of the word line of the lower layer is RCb, where RCt>RCb.

For example, the lower layer indicates any one of the memory cells MC0 to MC3 (or word lines WL0 to WL3), and the upper layer indicates any one of the memory cells MC4 to MC7 (or word lines WL4 to WL7).

3. Write Operation

With reference to FIGS. 5 to 11, a first example to a third example will be described as the write operation of the first embodiment.

Figure 5:
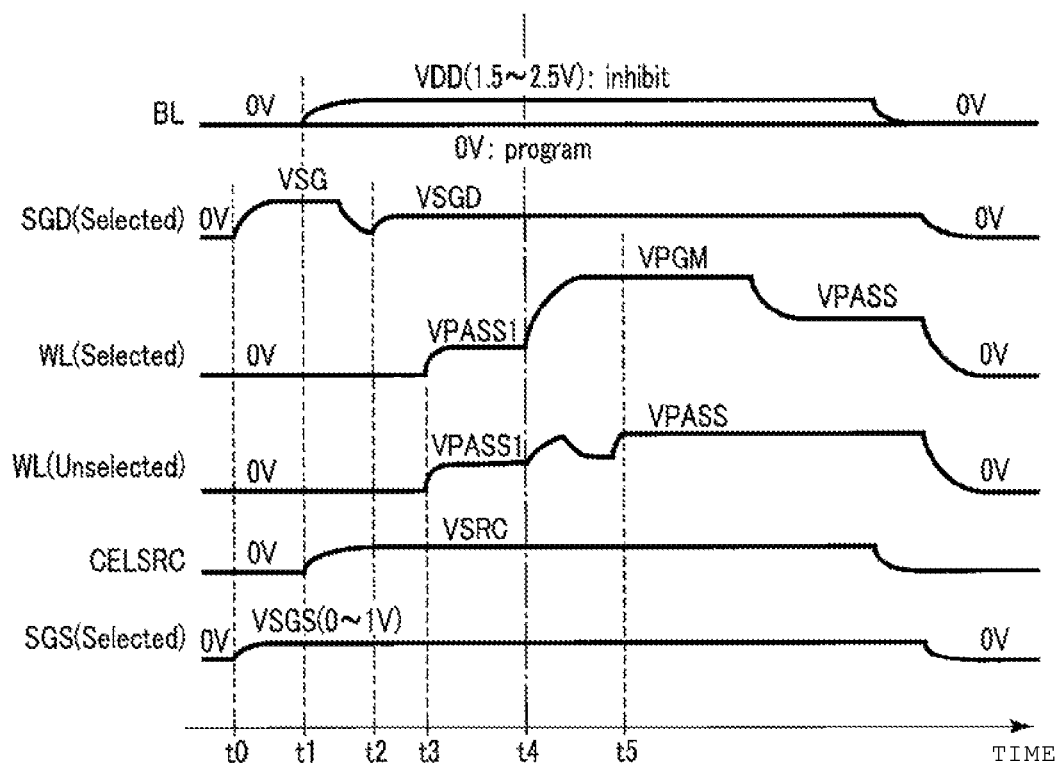
FIG. 5 is a timing diagram illustrating a write operation in the non-volatile semiconductor memory device.

At a timing t0 as illustrated in FIG. 5, the driver 12-2 supplies a voltage VSG to the select gate line SGD of the selected memory string MS. The voltage VSG causes the select transistor ST1 to be turned on, and the voltage VSG is higher than a voltage VSGD (VSG>VSGD).

At a timing t1, the sense amplifier 13 applies 0 V to a bit line BL which did not pass a program verification, and applies a voltage VDD to the bit line BL which has already passed the program verification and to the non-selected bit line BL. The select transistor ST1 transmits the voltage from a drain electrode to a source electrode. In addition, a source line driver (not illustrated) supplies a voltage VSRC to the source line CELSRC.

Subsequently, at a timing t2, the driver 12-2 supplies the voltage VSGD after decreasing a potential of the select gate line SGD to 0 V. Accordingly, the select transistor ST1 corresponding to the bit line BL which has already passed the verification and the non-selected bit line BL (that is, a bit line to which VDD is applied) is cut off. For the successive operations thereof, the first example to the third example are described. The write operation with respect to the memory cell of the upper layer of the first example is illustrated in FIG. 5.

3.1 First Example

3.1.1 Memory Cell of Upper Layer

At a timing t3 illustrated in FIG. 6, the driver 12-2 supplies an initial charging voltage VPASS1 to the selected word line and the non-selected word line of the upper layer of the selected memory string MS. The voltage VPASS1 is applied as the initial charging voltage before applying the voltage VPASS to the non-selected word line, and is lower than the voltage VPASS.

Subsequently, at a timing t4, the driver 12-2 supplies the voltage VPGM to the selected word line, and supplies the voltage VPASS to the non-selected word line. Thus, overshoot of the voltage of the non-selected word line occurs by being coupled with the voltage VPGM of the selected word line.

Because the capacitance of the word line of the upper layer is smaller than the capacitance of the word line of the lower layer, the voltage in which the voltage of the word line of the upper layer is changed by the overshoot is smaller than the voltage (to be described later) in which the voltage of the word line of the lower layer is changed by the overshoot. Meanwhile, the time constant RCt of the word line of the upper layer is larger than the time constant RCb of the word line of the lower layer, which means that a time taken for the overshoot of the voltage of the word line of the upper layer to stabilize is longer than a time taken for the overshoot of the voltage of the word line of the lower layer to stabilize.

The control circuit 15 settles down the overshoot of the voltage of the word line of the upper layer, and a time X1 taken for the voltage VPASS of the word line of the upper layer to stabilize is controlled to be the same as the time X1 taken for the voltage VPASS of the word line of the lower layer to stabilize by setting the initial charging voltage VPASS1 to be smaller than the voltage VPASS2 to be described later.

3.1.2 Memory Cell of Lower Layer

At a timing t3 illustrated in FIG. 7, the driver 12-2 supplies an initial charging voltage VPASS2 to the selected word line and the non-selected word line of the lower layer of the selected memory string MS. The voltage VPASS2 is applied as the initial charging voltage before applying the voltage VPASS to the non-selected word line. The voltage VPASS2 is higher than the voltage VPASS1, and is lower than the voltage VPASS (VPASS1<VPASS2<VPASS).

Subsequently, at a timing t4, the driver 12-2 supplies the voltage VPGM to the selected word line, and supplies the voltage VPASS to the non-selected word line. Overshoot of the voltage of the non-selected word line occurs by being coupled with the voltage VPGM of the selected word line.

The voltage at which the voltage of the word line of the lower layer is changed by the overshoot is larger than the voltage at which the voltage of the word line of the upper layer is changed by the overshoot. A time taken for the overshoot of the voltage of the word line of the lower layer to stabilize is shorter than a time taken for the overshoot of the voltage of the word line of the upper layer to stabilize.

The control circuit 15 settles down the overshoot of the voltage of the word line of the lower layer, and the time taken for the voltage VPASS of the word line of the lower layer to stabilize to be the same as the time X1 taken for the voltage VPASS of the word line of the upper layer to stabilize by setting the initial charging voltage VPASS2 to be higher than the voltage VPASS1.

Subsequently, a program operation is executed by increasing a voltage of the selected word line to the voltage VPGM, and increasing a voltage of the non-selected word line to the voltage VPASS (timing t5).

Otherwise, the select transistor ST1 is cut off in the memory string MS corresponding to the bit line BL which has already passed the verification and the non-selected bit line BL, and the channel is electrically floated. As a result, the potential of the channel increases by being coupled with the word line, and programming is prohibited. The above description is a description of the write operation.

3.2 Second Example 3.2.1 Memory Cell of Upper Layer

Figure 8:
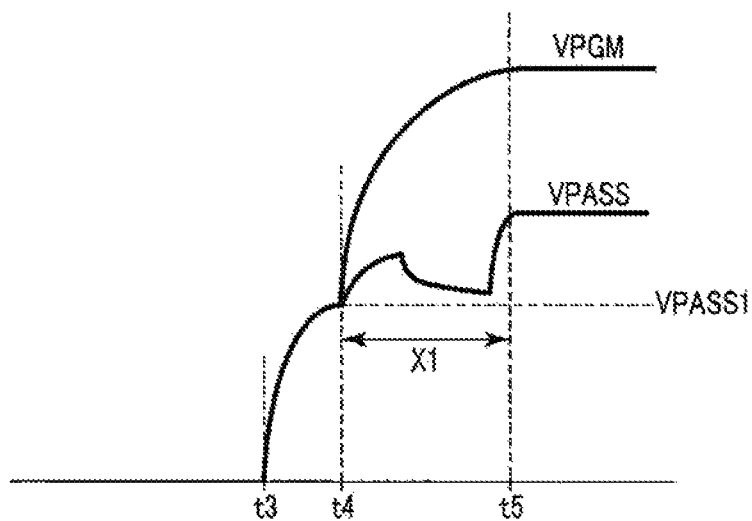
FIG. 8 a timing diagram illustrating a voltage waveform of the upper layer word line of a second example in the write operation.

As illustrated in FIG. 8, the voltage VPGM and the initial charging voltage VPASS1 are applied to the selected word line and the non-selected word line of the upper layer in the same manner as the first example. The control circuit 15 settles down the overshoot of the voltage of the word line of the upper layer, and the time taken for the voltage VPASS to stabilize is time X1 when the initial charging voltage is set to be the voltage VPASS1.

3.2.2 Memory Cell of Lower Layer

Figure 9:
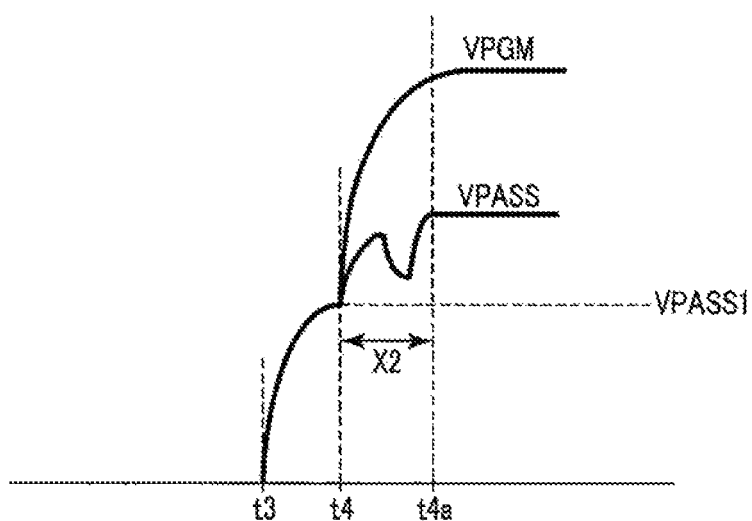
FIG. 9 is a timing diagram illustrating a voltage waveform of the lower layer word line of the second example in the write operation.

As illustrated in FIG. 9, at a timing t3, the driver 12-2 supplies the voltage VPASS1 to the selected word line and the non-selected word line of the lower layer of the selected memory string MS in the same manner as the upper layer (timing t3). The control circuit 15 settles down the overshoot of the voltage of the word line of the lower layer, and the time taken for the voltage VPASS to stabilize is time X2 when the initial charging voltage is set to be same as that of the upper layer, namely VPASS1.

Subsequently, at a timing t4, the driver 12-2 supplies the voltage VPGM to the selected word line, and supplies the voltage VPASS to the non-selected word line. Thus, the overshoot of the voltage of the non-selected word line occurs by being coupled with the voltage VPGM of the selected word line.

As described above, the voltage at which the voltage of the word line of the lower layer is changed by the overshoot is larger than that of the upper layer, whereas the time taken for the overshoot of the voltage of the word line of the lower layer to settle down is shorter than that of the upper layer. The time taken for the voltage VPASS to stabilize in the lower layer is X2 and is shorter than that of the upper layer.

Subsequently, the program operation is executed by increasing the voltage of the selected word line to the voltage VPGM, and increasing the voltage of the non-selected word line to the voltage VPASS (timing t4a).

3.3 Third Example

Figure 10:
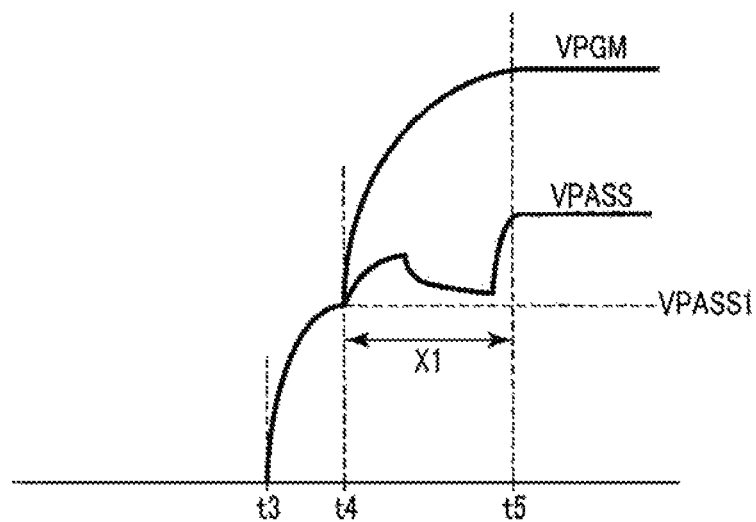
FIG. 10 is a timing diagram illustrating a voltage waveform of the upper layer word line of a third example in the write operation.
Figure 11:
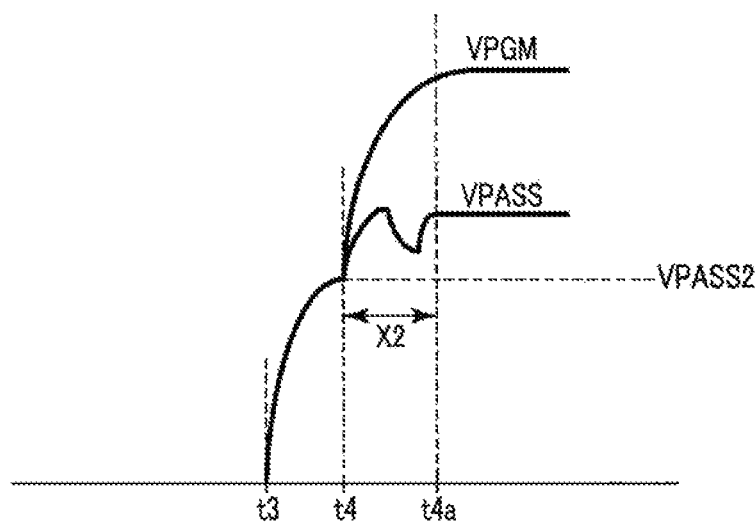
FIG. 11 is a timing diagram illustrating a voltage waveform of the lower layer word line of the third example in the write operation.

A third example is a combination of the first example and the second example. In the first example, the initial charging voltages in the upper layer and the lower layer are changed, and in the second example, the time taken for the voltages VASS of the upper layer and the lower layer to stabilize is changed. In the third example, as illustrated in FIG. 10 and FIG. 11, in the upper layer and the lower layer, the initial charging voltages being applied to the word line and the time taken for the voltages VPASS to stabilize are both changed. Other configurations and operations thereof are the same as those of the first example and the second example. Accordingly, the first example and the second example are may be combined with each other.

4. Read Operation

Figure 12:
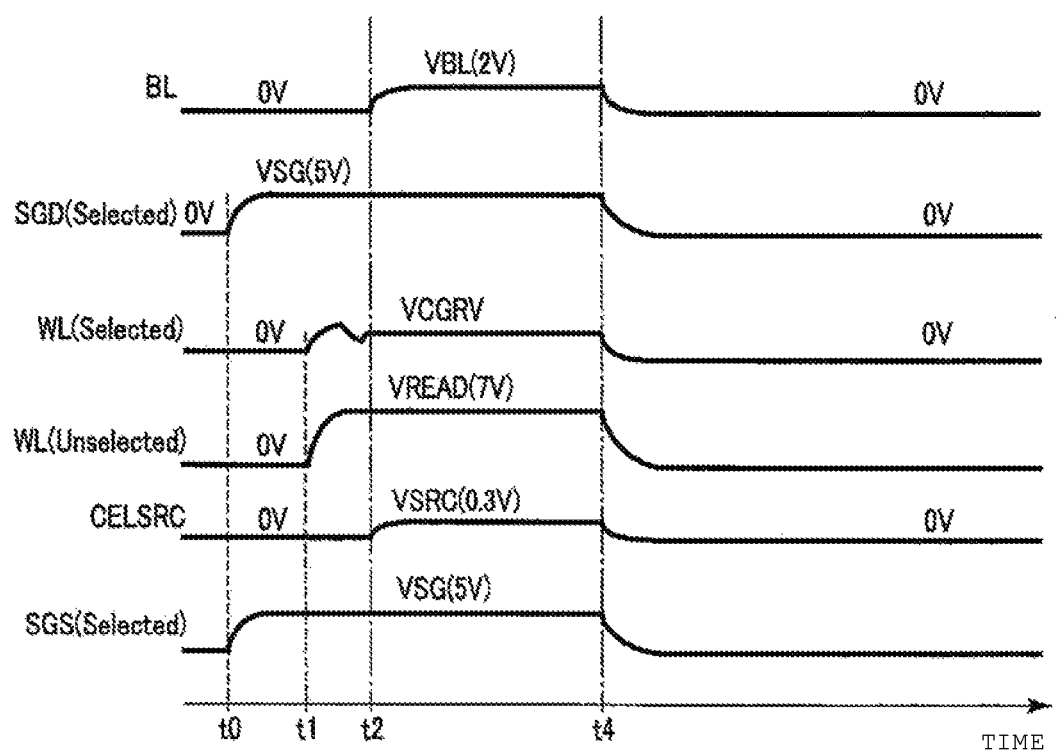
FIG. 12 is a timing diagram illustrating a read operation in the non-volatile semiconductor memory device according to the first embodiment.
Figure 13:
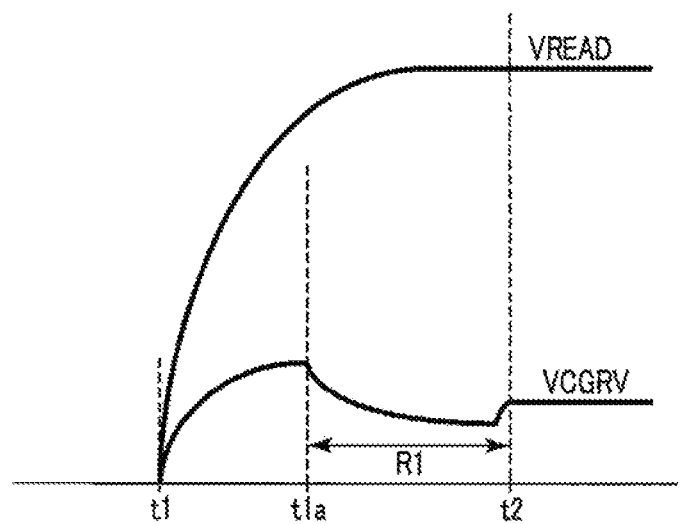
FIG. 13 is a timing diagram illustrating the voltage waveform of the upper layer word line in the read operation.
Figure 14:
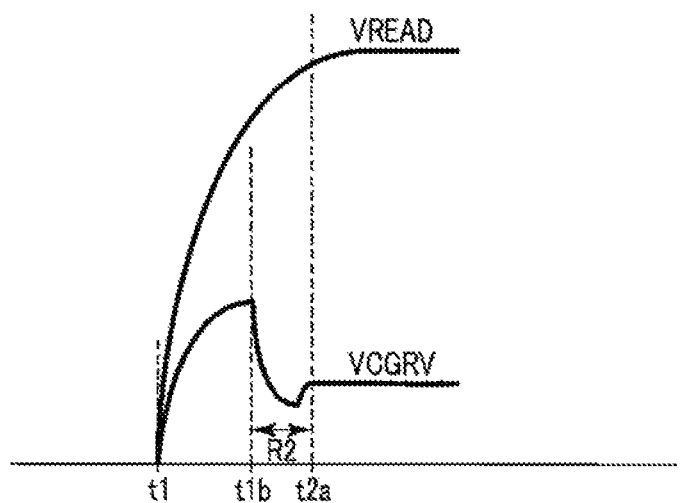
FIG. 14 is a timing diagram illustrating the voltage waveform of the lower layer word line in the read operation.

With reference to FIG. 12, FIG. 13, and FIG. 14, the read operation will be described. As illustrated in FIG. 12, at a timing t0, the driver 12-2 transmits the voltage VSG to the select gate lines SGD and SGS of the selected memory string MS.

4.1 Memory Cell of Upper Layer

Subsequently, at a timing t1, as illustrated in FIG. 12 and FIG. 13, the driver 12-2 supplies the voltage VREAD (for example, 7 V) to the non-selected word line WL of the upper layer of the selected memory string MS. In addition, the driver 12-2 supplies the voltage VCGRV to the selected word line WL. As a result, the overshoot of the voltage of the selected word line WL occurs by being coupled with the voltage VREAD of the non-selected word line. FIG. 12 illustrates the read operation with respect to the memory cell of the upper layer.

The voltage in which the voltage of the word line of the upper layer is changed by the overshoot is smaller than that of the lower layer to be described later. Meanwhile, the time R1 taken for the overshoot of the voltage of the word line of the upper layer to stabilize is longer than that of the lower layer.

4.2 Memory Cell of Lower Layer

Meanwhile, at a timing t1, as illustrated in FIG. 14, the driver 12-2 supplies the voltage VREAD (for example, 7 V) to the non-selected word line WL of the lower layer of the selected memory string MS, and supplies the voltage VCGRV to the selected word line WL. As a result, the overshoot of the voltage of the selected word line WL occurs by being coupled with the voltage VREAD of the non-selected word line.

The voltage at which the voltage of the word line of the lower layer is changed by the overshoot is larger than that of the upper layer. Meanwhile, the time R2 taken for the overshoot of the voltage of the word line of the lower layer to stabilize is shorter than the time R1 of the upper layer.

Next, at a timing t2, the sense amplifier 13 pre-charges the bit line BL with the voltage VBL (for example, 2 V). At this time, the source line driver (not illustrated) applies the voltage VSRC (for example, 0 V to 0.3 V) to a cell source line CELSRC. The sense amplifier 13, for example, senses cell current flowing in the bit line BL, and reads the data of the memory cells of the upper layer and the lower layer. Subsequently, at a timing t4, the selected word line, the non-selected word line, and the bit line are discharged to 0 V.

5. Effects of Embodiments

According to the non-volatile semiconductor memory device in the first embodiment, the write time and the read time may be shortened.

Hereinafter, effects will be described in detail.

In the write operation of the embodiment, depending on whether that the memory cell is arranged on the upper layer or the lower layer in three dimensional structures, the initial charging voltages VPASS1 applied to the non-selected word lines of the upper layer and the initial charging voltage VPASS2 applied to the non-selected word line of the lower layer are changed. In addition, depending on whether the memory cell is arranged on the upper layer or the lower layer, the overshoot generated in the voltage VPASS of the non-selected word line settles down, and the time taken for the voltage VPASS to stabilize is changed.

In the write operation of the first example, even when the overshoots of the voltages VPASS of the non-selected word lines of the upper layer and the lower layer are generated by being coupled with the voltage VPGM, the initial charging voltage VPASS1 and VPASS2 are set so that the time X1 taken for the voltages VPASS of the non-selected word lines of the upper layer and the lower layer to stabilize becomes substantially equal. Accordingly, the time taken for the voltage of the non-selected word line to increase to the voltage VPASS may be shortened, whereby the write operation may be executed at a higher speed.

In the write operation of the second example, in the same manner, even when the overshoots of the voltages VPASS of the non-selected word lines of the upper layer and the lower layer are generated, the initial charging voltage is set to be constant as VPASS1 so that the time X2 taken for the voltage VPASS of the non-selected word line of the lower layer to stabilize is shorter than the time X1 of the upper layer. Accordingly, a time when writing of the memory cell of the lower layer starts may be shortened than a time when writing of the memory cell of the upper layer starts. As a result, the write operation with respect to the memory cell of the lower layer may be executed at a higher speed.

The third example is the combination of the first example and the second example described above, and the write operation may be executed at a higher speed in the same manner as that of the first example and the second example.

In addition, the read operation of the embodiment, depending on whether the memory cell is positioned on the lower layer or the upper layer, the overshoot of the selected word line settles down, and a waiting time taken for the voltage VCGRV to stabilize is changed. That is, a waiting time R2 taken for the voltage VCGRV of the selected word line of the lower layer to stabilize is set to be shorter than the time R1 of the upper layer. Accordingly, reading of the memory cell of the lower layer may be executed at a higher speed, and the read time may be shortened.

Here, depending on whether the memory cell (or word line) is positioned on the upper layer or on the lower layer, at least any one of the waiting time X1, X2, R1, and R2 taken for the initial charging voltage VPASS1 and VPASS2 or the voltage VPASS and VCGRV to stabilize is changed. However, there is no limitation thereto, in that the memory cells may be divided in plural groups in the stacking direction, and the initial charging voltage or a waiting time may be changed for every group.

Second Embodiment

In the second embodiment, in the write operation and the read operation, the cell source line voltage and the word line voltage increase substantially at the same time. According to an increase of the cell source line voltage, the word line voltage increases by being coupled with the cell source line voltage, and the voltage of the word line may increase faster than otherwise. Hereinafter, in the write operation and the read operation of the second embodiment, features different from the first embodiment described above will be described. Other configurations and operations are same as that of the first embodiment.

1. Write Operation

Figure 15:
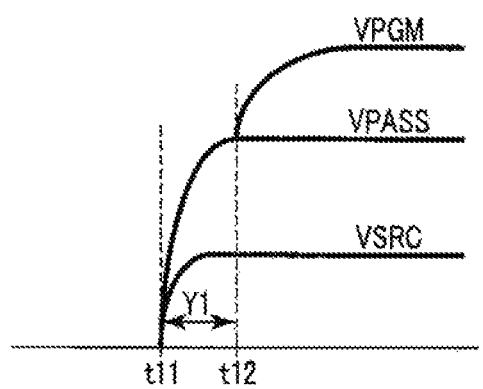
FIG. 15 is a timing diagram illustrating a write operation in the non-volatile semiconductor memory device according to a second embodiment.

As illustrated in FIG. 15, at a timing t11, the driver 12-2 supplies the voltage VPASS to the selected word line WL and the non-selected word line WL. Substantially at the same time of supplying the voltage VPASS, the voltage VSRC is supplied to the cell source line CELSRC at the timing t11. As a result, the voltage of the selected word line and the non-selected word line increase by being coupled with the voltage VSRC of the cell source line CELSRC. Accordingly, increasing to the voltage VPASS of the selected word line and the non-selected word line is faster, and a time Y1 (timings t11 to t12) taken for reaching the voltage VPASS is shortened.

Subsequently, the driver 12-2 supplies the voltage VPGM to the selected word line, and boosts the voltage of the selected word line from the voltage VPASS to the voltage VPGM. In addition, the voltage of the non-selected word line is maintained as the voltage VPASS. As described above, writing is executed on the memory cell MC connected to the selected word line.

Moreover, in the above described the write operation, supplying of a voltage VSRC to the cell source line CELSRC is executed simultaneously when the voltage VPASS is started to be supplied to the word line; however, there is no limitation thereto. The voltage VSRC may be supplied from the time when the voltage VPASS is started to be supplied to the word line until the voltage of the word line reaches the voltage VPASS. Accordingly, it is possible to enhance the increase of the voltage of the word line to the voltage VPASS.

2. Read Operation

Figure 16:
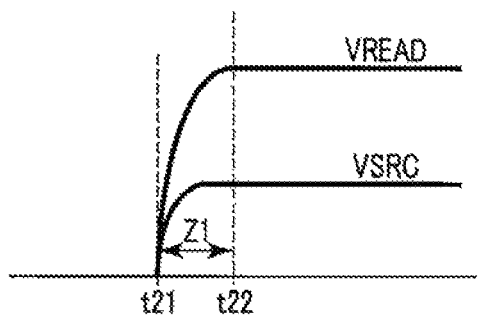
FIG. 16 is a timing diagram illustrating a read operation in the non-volatile semiconductor memory device according to the second embodiment.

As illustrated in FIG. 16, at a timing t21, the driver 12-2 supplies the voltage VREAD to the non-selected word line WL. At the timing t21, the voltage VSRC is supplied to the cell source line CELSRC substantially at the same time the voltage VREAD is supplied. As a result, the voltage of the non-selected word line increases by being coupled with the voltage VSRC of the cell source line CELSRC. That is, an increase of the voltage VSRC of the cell source line CELSRC enhances the increase of the voltage of the non-selected word line. Accordingly, the increasing of the voltage of the non-selected word line to the voltage VREAD is achieved faster, and the time Z2 (timings t21 to t22) reaching the voltage VREAD is shortened.

In addition, the driver 12-2 supplies the voltage VCGRV (not illustrated) to the selected word line. Accordingly, the memory cell MC connected to the selected word line is read.

Moreover, in the same manner as the write operation, in the above described read operation, applying the voltage VSRC to the cell source line CELSRC is executed substantially at the same time as when the voltage VREAD is started to be supplied to the non-selected word line; however, in the same manner as the write operation described above, the voltage VSRC may be supplied from the time when the voltage VREAD is started to be supplied to the word line until the voltage of the word line reaches the voltage VREAD. Accordingly, it is possible to enhance the increasing of the voltage of the non-selected word line to the voltage VREAD.

3. Effects of Embodiment

According to the non-volatile semiconductor memory device in the second embodiment, the write time and the read time may be shortened.

Comparative examples thereof will be described for the sake of easy understanding. Moreover, same symbols are given to the same configurations in the comparative example.

For example, in the write operation, first, the voltage VSRC of the cell source line CELSRC increases, subsequently, the voltage of the selected word line and the non-selected word line increase to the voltage VPASS (comparative example 1). In the comparative example 1, since the voltage of the word line voltage increases by being coupled with the voltage VSRC of the cell source line, there is a need to wait for the voltage of the word line voltage to settle down.

In addition, for example, in the write operation, there is a case in which first, the voltages of the selected word line and the non-selected word line increase to the voltage VPASS, subsequently, the voltage VSRC of the cell source line CELSRC increases (comparative example 2). In the comparative example 2, since the voltage VPASS of the non-selected word line increase by being coupled with the cell source line voltage VSRC, there is a need to wait for the voltage of the non-selected word line to settle down to the voltage VPASS.

In contrast, according to the write operation of the second embodiment, substantially at the same time of increasing of the voltage of the selected word line and the voltage of the non-selected word line, the voltage VSRC of the cell source line CELSRC increases. The increase of the voltage VSRC of the cell source line enhances the increase of the voltage of the selected word line and the non-selected word line to the voltage VPASS. Accordingly, the time taken for the voltage of the selected word line and the non-selected word line to reach the voltage VPASS may be shortened, and the write time may be shortened.

In addition, for example, in the read operation, there is a case in which first, the voltage VSRC of the cell source line CELSRC increases, subsequently, the voltage of the non-selected word line increases to the voltage VREAD (comparative example 3). In the comparative example 3, since the voltage of the non-selected word line increases by being coupled with the voltage VSRC of the cell source line, there is a need to wait for settling down.

In addition, for example, in the read operation, there is a case in which first, the voltage of the non-selected word line increases to the voltage VREAD, subsequently, the voltage VSRC of the cell source line CELSRC increases (comparative example 4). In the comparative example 4, since the voltage VREAD of the non-selected word line increases by being coupled with the cell source line voltage VSRC, there is a need to wait for the voltage of the non-selected word line to settle down to the voltage VREAD.

In contrast, according to the read operation the second embodiment, substantially at the same time of increasing the voltage of the non-selected word line, the voltage VSRC of the cell source line CELSRC increases. The increase of the voltage VSRC the cell source line enhances the increase of the voltage of the non-selected word line to the voltage VREAD. Accordingly, the time taken for the voltage of the non-selected word line to reach the voltage VREAD may be shortened, and the read time may be shortened.

Moreover, a configuration of the memory cell array 11, for example, is disclosed in "Three dimensional stacked non-volatile semiconductor memory" which is U.S. patent application Ser. No. 12/407,403 filed in Mar. 19, 2009. In addition, the configuration is also disclosed in "Three dimensional stacked non-volatile semiconductor memory" which is U.S. patent application Ser. No. 12/406,524 filed in Mar. 18, 2009, "Non-volatile semiconductor memory device and manufacturing method for the same" which is U.S. patent application Ser. No. 12/679,991 filed in Mar. 25, 2010, and "Semiconductor memory and manufacturing method for the same" which is U.S. patent application Ser. No. 12/532,030 filed in Mar. 23, 2009. The entire contents of these patent applications are incorporated in this specification by reference.

Moreover, in each embodiment, (1) in the read operation, a voltage being applied the word line selected in the read operation at an A level is, for example, between 0 V to 0.55 V. However, it is not limited thereto, and the voltage may be between 0.1 V to 0.24 V, 0.21 V to 0.31 V, 0.31 V to 0.4 V, 0.4 V to 0.5 V, or 0.5 V to 0.55 V.

A voltage being applied the word line selected in the read operation at a B level is, for example, between 1.5 V to 2.3 V. However, it is not limited thereto, and the voltage may be between 1.65 V to 1.8 V, 1.8 V to 1.95 V, 1.95 V to 2.1 V, or 2.1 V to 2.3 V.

A voltage being applied the word line selected in the read operation at a C level is, for example, between 3.0 V to 4.0 V. However, it is not limited thereto, and the voltage may be between 3.0 V to 3.2 V, 3.2 V to 3.4 V, 3.4 V to 3.5 V, 3.5 V to 3.6 V, or 3.6 V to 4.0 V.

As a time (tR) of the read operation, for example, it may be between 25 μs to 38 μs, 38 μs to 70 μs, or 70 μs to 80 μs. (2) The write operation includes a program operation and verification operation as described above. In the write operation, a voltage may be voltages described below in addition to 15.0 V to 23.0 V.

Specifically, a voltage applied first to the word line selected during the program operation is, for example, between 13.7 V to 14.3 V. However, it is not limited thereto, and the voltage may be between 13.7 V to 14.0 V or 14.0 V to 14.6 V.

A voltage applied first to the word line selected during writing odd-numbered word lines and voltage applied first to the word line selected during writing even-numbered word lines may be changed.

When the program operation is executed in the Incremental Step Pulse Program (ISPP) method, as a step-up voltage, for example, substantially 0.5 V is exemplified.

In addition, as a voltage applied to the non-selected word line, a voltage may be voltages described below in addition to 7.0 V to 10.0 V described above.

Specifically, a voltage applied to the non-selected word line may be, for example, between 6.0 V to 7.3 V. It is not limited thereto, and for example, the voltage may be between 7.3 V to 8.4 V, or may be equal to or lower than 6.0 V.

Depending on whether the non-selected word line is the odd-numbered word line, or the even-numbered word line, a pass voltage being applied may be changed.

A time (tProg) of the write operation may be, for example, between 1,700 μs to 1,800 μs, 1,800 μs to 1,900 μs, or 1,900 μs to 2,000 μs. (3) In an erase operation, a voltage being applied first to a well, which is formed on an upper portion of a semiconductor substrate, in which the memory cell is arranged over thereof is, for example, between 12 V to 13.6 V. It is not limited thereto, and for example, the voltage may be between 13.6 V to 14.8 V, 14.8 V to 19.0 V, 19.0 V to 19.8 V, or 19.8 V to 21 V.

A time (tErase) of the erase operation is, for example, between 3,000 μs to 4,000 μs, 4,000 μs to 5,000 μs, or 4,000 μs to 9,000 μs. (4) A structure of the memory cell includes a charge storage layer arranged on the semiconductor substrate (silicon substrate) through a tunnel insulating film having a thickness of 4 nm to 10 nm. The charge storage layer may have a stacked structure of an insulating film such as SiN or SiON having a thickness of 2 nm to 3 nm and polysilicon having a thickness of 3 nm to 8 nm. In addition, it is preferable that the polysilicon includes metal such as Ru. The insulating film is provided on the charge storage layer. The insulating film includes, for example, a silicon oxide film having a thickness of 4 nm to 10 nm interposed between a lower layer High-k film having a thickness of 3 nm to 10 nm and a upper layer High-k film having a thickness of 3 nm to 10 nm. An example of the High-k film includes HfO, or the like. In addition, the thickness of the silicon oxide film may be larger than that of the High-k film. A control electrode having a thickness of 30 nm to 70 nm is formed on the insulating film through a material having a thickness of 3 nm to 10 nm. The material is a metal oxide film such as TaO or is a metal nitride film such as TaN. The control electrode may be made of W, or the like.

In addition, air gaps may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a first memory cell above a substrate and electrically connected to a first word line;
   a second memory cell above the first memory cell and electrically connected to a second word line; and
   a controller configured to execute a write operation that includes a first step, a second step after the first step, and a third step after the second step, wherein
   in the first step, a first voltage is applied to the first word line and to a first non-selected word line when the first memory cell is being written, and a second voltage that is lower than the first voltage is applied to the second word line and to a second non-selected word line when the second memory cell is being written;
   in the second step, a first program voltage is applied to the first word line when the first memory cell is being written, and a second program voltage is applied to the second word line when the second memory cell is being written;
   in the third step, a third voltage higher than the first and second voltages is applied to the first non-selected word line when the first memory cell is being written and to the second non-selected word line when the second memory cell is being written; and
   a time period between a start of the second step and a start of the third step is different depending on whether the first memory cell is being written or the second memory cell is being written.

2. The device according to claim 1, wherein
   the time period between the start of the second step and the start of the third step is longer when the second memory cell is being written than when the first memory cell is being written.

3. The device according to claim 1, wherein the first program voltage and the second program voltage are the same.

4. The device according to claim 1, wherein an overshoot of the voltage applied to the first or second non-selected word line in the first step occurs as a result of the program voltage being applied to the first or second word line in the second step, and the third step is started when the overshoot is stabilized.

5. The device according to claim 4, wherein the time taken to stabilize the overshoot is shorter when the first memory cell is being written than when the second memory cell is being written.

6. The device according to claim 1, further comprising a semiconductor pillar extending above substrate, wherein channel regions of the first and second memory cells are formed on the semiconductor pillar at different distances away from the substrate, the channel region of the first memory cell having a smaller cross-section area than the channel region of the second memory cell.

7. The device according to claim 1, wherein the first non-selected word line is adjacent to the first word line and the second non-selected word line is adjacent to the second word line.

8. A non-volatile semiconductor memory device comprising:
   a first memory cell above a substrate and electrically connected to a first word line;

a second memory cell above the first memory cell and electrically connected to a second word line; and a controller configured to execute a write operation that includes a first step, a second step after the first step, and a third step after the second step, wherein in the first step, a first voltage is applied to the first word line and to a first non-selected word line when the first memory cell is being written, and a second voltage that is different from the first voltage is applied to the second word line and to a second non-selected word line when the second memory cell is being written;

in the second step, a first program voltage is applied to the first word line when the first memory cell is being written, and a second program voltage is applied to the second word line when the second memory cell is being written; and in the third step, a third voltage higher than the first and second voltages is applied to the first non-selected word line when the first memory cell is being written and a fourth voltage higher than the first and second voltages is applied to the second non-selected word line when the second memory cell is being written.

9. The device according to claim 8, wherein the second voltage is lower than the first voltage.

10. The device according to claim 8, wherein the time period between the start of the second step and the start of the third step when the first memory cell is being written and the time period between the start of the second step and the start of the third step when the second memory cell is being written are substantially the same.

11. The device according to claim 8, wherein the time period between the start of the second step and the start of the third step is longer when the second memory cell is being written than when the first memory cell is being written.

12. The device according to claim 8, wherein the third voltage and the fourth voltage are the same.

13. The device according to claim 8, wherein the first program voltage and the second program voltage are the same.

14. The device according to claim 8, further comprising a semiconductor pillar extending above substrate, wherein channel regions of the first and second memory cells are formed on the semiconductor pillar at different distances away from the substrate, the channel region of the first memory cell having a smaller cross-section area than the channel region of the second memory cell.

15. A method of performing a write operation in a non-volatile semiconductor memory device comprising a first memory cell above a substrate and electrically connected to a first word line and a second memory cell above the first memory cell and electrically connected to a second word line, the write operation including a first step, a second step after the first step, and a third step after the second step, said method comprising:

in the first step, applying a first voltage to the first word line and to a first non-selected word line when the first memory cell is being written and applying a second voltage that is different from the first voltage to the second word line and to a second non-selected word line when the second memory cell is being written;

in the second step, applying a first program voltage to the first word line when the first memory cell is being written and applying a second program voltage to the second word line when the second memory cell is being written; and in the third step, applying a third voltage higher than the first and second voltages to the first non-selected word line when the first memory cell is being written and applying a fourth voltage higher than the first and second voltages to the second non-selected word line when the second memory cell is being written.

16. The method according to claim 15, wherein the second voltage is lower than the first voltage.

17. The method according to claim 15, wherein the time period between the start of the second step and the start of the third step when the first memory cell is being written and the time period between the start of the second step and the start of the third step when the second memory cell is being written are substantially the same.

18. The method according to claim 15, wherein the time period between the start of the second step and the start of the third step is longer when the second memory cell is being written than when the first memory cell is being written.

19. The method according to claim 15, wherein the third voltage and the fourth voltage are the same.

20. The method according to claim 15, wherein the first program voltage and the second program voltage are the same.

* * * * *